United States Patent
Yatskan et al.

(10) Patent No.: US 11,276,725 B2
(45) Date of Patent: Mar. 15, 2022

(54) ACTIVE-PIXEL SENSOR ARRAY

(71) Applicant: NewSight Imaging Ltd., Ness Ziona (IL)

(72) Inventors: Eyal Yatskan, Ness Ziona (IL); Eli Assoolin, Ness Ziona (IL)

(73) Assignee: NewSight Imaging Ltd., Ness Ziona (IL)

( * ) Notice: Subject to any disclaimer, the term of this patent is extended or adjusted under 35 U.S.C. 154(b) by 0 days.

(21) Appl. No.: 16/462,760

(22) PCT Filed: Nov. 28, 2017

(86) PCT No.: PCT/IL2017/051292
§ 371 (c)(1),
(2) Date: May 21, 2019

(87) PCT Pub. No.: WO2018/096546
PCT Pub. Date: May 31, 2018

(65) Prior Publication Data
US 2019/0348461 A1    Nov. 14, 2019

(51) Int. Cl.
*H01L 27/146* (2006.01)
*H04N 5/359* (2011.01)
*H04N 5/374* (2011.01)

(52) U.S. Cl.
CPC ....... *H01L 27/14643* (2013.01); *H04N 5/359* (2013.01); *H04N 5/374* (2013.01)

(58) Field of Classification Search
None
See application file for complete search history.

(56) References Cited

U.S. PATENT DOCUMENTS

| | | | |
|---|---|---|---|
| 9,106,856 B2* | 8/2015 | Ohtsuki | H04N 5/378 |
| 2006/0231739 A1* | 10/2006 | Sekine | H01L 27/14609 |
| | | | 250/208.1 |
| 2014/0267858 A1* | 9/2014 | Ohtsuki | H01L 27/14603 |
| | | | 348/302 |
| 2015/0092094 A1* | 4/2015 | Itonaga | H04N 9/04561 |
| | | | 348/300 |
| 2015/0318324 A1* | 11/2015 | Kudoh | H01L 27/14614 |
| | | | 257/225 |

* cited by examiner

*Primary Examiner* — Long Pham
(74) *Attorney, Agent, or Firm* — Patshegen IP LLC; Moshe Pinchas

(57) ABSTRACT

An active pixel sensor is provided including a two-dimensional array of photodiodes arranged in at least two rows and a plurality of columns; a plurality of groups of photodiodes each having a floating diffusion region coupled thereto and being configured to receive electrons generated by photodiodes in the group; wherein the plurality of groups includes at least one first group disposed on a first row of the array, and at least one second group disposed on a second row of the array; and wherein the first group includes at least one photodiode on a first column and at least one photodiode on a second column, and the second group includes at least one photodiode on the second column and at least one photodiode on a third column.

16 Claims, 4 Drawing Sheets

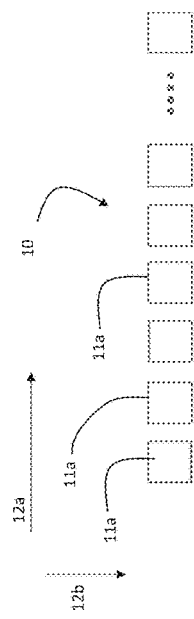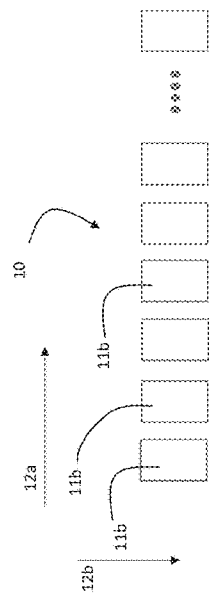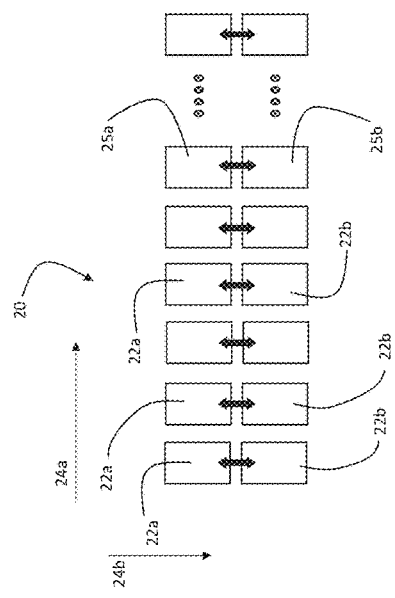

ACTIVE-PIXEL SENSOR ARRAY

FIELD OF INVENTION

The presently disclosed subject matter relates to an active-pixel sensor array, in general, and in particular to an active-pixel sensor array for an image having a high resolution in one of the dimensions thereof.

BACKGROUND

Active-photodiodes (APS) include an array of pixel sensors, each pixel containing a photodetector, employing various technologies such as CMOS, CCD, etc.

In general, it is desired to improve the pixel sensitivity, such that each pixel can generate a sufficient number of electrons in response to photon strikes on the active surface of the pixel. Thus, increasing the active area of each pixel sensor results in an enhanced sensitivity of the pixel. In some applications, the electrons generated by each pixel are utilized to form a single pixel of a detected image, increasing the area of each pixel requires to either reduce the number of photodiodes in one of the dimensions of the detected image, or to increase the size of the entire active-pixel sensors. While reducing the number of pixels in the detected image directly reduces the resolution of the image, increasing the size of the array of pixel sensors, requires changing the physical dimensions of the detector.

In some applications, it is required that the pixel array includes a large number of pixels in one dimension of the array (for example 2048), while fewer pixels in the other dimension of the array. Such an array, which provides an image having a high resolution in one of the dimensions thereof, is commonly utilized in line scanners and laser LIDARs.

Accordingly, as shown in FIGS. 1A and 1B, for these applications, it is possible to arrange the photodiodes 11a on the array 10 along a first dimension 12a (FIG. 1A). In order to increase the sensitivity of each pixel the active region of each pixel sensor 11b can be expanded in a second dimension 12b (FIG. 1B). This way the sensitivity of each pixel sensor is increased, while maintaining the resolution of the entire array along the first dimension.

Increasing the dimension of each pixel sensor 11 in the second dimension 12b, is however limited to a certain dimension by the semiconductor technology, due to technical difficulties related to the readout of pixels, i.e. the so-called diffusion length of charge carriers in a semiconductor.

As shown in FIG. 2, one known solution for increasing the sensitivity of each pixel sensor is binning technology. A pixel array 20 can include a large number of photodiodes 22 disposed along one dimension 24a thereof. Each pixel sensor 22 includes an active region which is increased along a second dimension 24b of the array, as in the array 10 of FIG. 1. In addition, the photodiodes 22 in the pixel array 20 are arranged in a first row 25a and a second row 25b. The first and second row are extended along the first dimension, and are disposed with respect to one another along the second dimension 24b. Each one of the pixels in the first row 25a is coupled to the corresponding pixels of the second row 25b such that the two coupled photodiodes 22a and 22b are configured for binning operation such that the readout of the two coupled photodiodes 22a and 22b is carried out through a common floating diffusion region (not shown). This way, the active region of each pixel sensor is the sum of the active region of the two adjacent pixels sensors 22a and 22b in the first row 25a and the second row 25b, respectively. The arrangement of the photodiodes in two adjacent rows thus allows increasing the sensitivity of the array however without compromising on the resolution of the image obtained by the number of pixel along the first dimension of the array 20.

As shown in FIG. 3, grouping of photodiodes in a pixel array 30 can be carried out by grouping four adjacent photodiodes 32a, 32b, 32c, and 32d.

The pixel array 30 includes two rows 35a and 35b, such that each group of pixels include two photodiodes from the first row 35a and two photodiodes from the second row 35b. The pixel array 30 thus includes a plurality of groups 41, 42, 43, etc. arranged along a first dimension 38a, each having a floating diffusion region 45 configured to allow a common readout of all the photodiodes 32a, 32b, 32c, and 32d in each group. It is appreciated that the resolution of the array 30 of this example is lower than that of array 20 of FIG. 2, this is due to the fact that adjacent photodiodes are arranged along the same dimension as the dimension along which the array is arranged, i.e. the first arranged. In other words, if the number of photodiodes along the first dimension 38a is limited, for example, due to space or structural constrains, Alternatively, the array must include double the amount of photodiodes along the first dimension of the array.

SUMMARY OF INVENTION

There is provided in accordance with an aspect of the presently disclosed subject matter an active pixel sensor. The active pixel sensor includes a two-dimensional array of photodiodes arranged in at least two rows and a plurality of columns; a plurality of groups of photodiodes each having a floating diffusion region coupled thereto and being configured to receive electrons generated by photodiodes in the group; wherein the plurality of groups includes at least one first group disposed on a first row of the array, and at least one second group disposed on a second row of the array; and wherein the first group includes at least one photodiode on a first column and at least one photodiode on a second column, and the second group includes at least one photodiode on the second column and at least one photodiode on a third column.

The at least one first group can include a plurality of first groups disposed along the first row of the array, and the at least one second group includes a plurality of second groups disposed along the second row of the array.

Each one of the second groups can be disposed adjacent two of the first groups, such that at least one photodiode of the second group is on the same column as at least one photodiode of one of the two first groups, and at least one photodiode of the second group is on the same column as at least one photodiode of the other one of the two first groups.

The first row of the array can include two first adjacent rows, and the second row of the array includes two second adjacent rows; and wherein each of the first groups includes at least four photodiodes, two of which being disposed on one of the two first adjacent rows, and two of which being disposed on the other one of the two first adjacent rows, and each of the second groups includes at least four sensing pixels, two of which disposed on one of the two second adjacent rows, and two of which disposed on the other one of the two second adjacent rows.

The plurality of columns can be disposed along a first dimension of the array, and wherein resolution along a first dimension of an image obtained by the sensor corresponds to the number of the plurality of columns; and wherein sensitivity of the image is proportional to the number of rows disposed along a second dimension of the array.

Each one of the plurality of first groups can be shifted with respect to adjacent first groups and with respect to adjacent second groups along a first dimension of the array, and further shifted with respect to adjacent second groups along a second dimension of the array.

Each one of the first groups partially overlap with two adjacent second groups.

The at least one floating diffusion region includes a first and a second floating diffusion region. The photodiodes are configured to dynamically and selectively be grouped in a first group arrangement in which the charges of the photodiodes in the group is stored the first floating diffusion regions and a second group arrangement in which the charges of the photodiodes in the group is stored the second floating diffusion regions.

Each of the groups can include at least one first photodiode configured to emit charges into the first and at least one second photodiode configured to emit charges into the second floating diffusion region.

There is provided in accordance with another aspect of the presently disclosed subject matter a method for detecting light with an active pixel sensor. The method includes providing a two-dimensional array of photodiodes arranged in at least two rows and a plurality of columns; defining a plurality of groups of photodiodes; forming a plurality of floating diffusion regions, each of which being coupled to one of the groups, and being configured to receive electrons generated by photodiodes in the group; wherein the plurality of groups includes at least one first group defined on a first row of the array, and at least one second group defined on a second row of the array; and, wherein the first group includes at least one photodiode on a first column and at least one photodiode on a second column, and the second group includes at least one sensing pixel on the second column and at least one sensing pixel on a third column.

The at least one first group can include a plurality of first groups disposed along the first row of the array, and the at least one second group includes a plurality of second groups disposed along the second row of the array.

Each one of the second groups can be disposed adjacent two of the first groups, such that at least one sensing pixel of the second group is on the same column as at least one sensing pixel of one of the two first groups, and at least one sensing pixel of the second group is on the same column as at least one sensing pixel of the other one of the two first groups.

The first row of the array can include two first adjacent rows, and the second row of the array includes two second adjacent rows; and wherein each of the first groups includes at least four sensing photodiodes, two of which being disposed on one of the two first adjacent rows, and two of which being disposed on the other one of the two first adjacent rows, and each of the second groups includes at least four sensing photodiodes, two of which disposed on one of the two second adjacent rows, and two of which disposed on the other one of the two second adjacent rows.

Each one of the plurality of first groups can be shifted with respect to adjacent first groups and with respect to adjacent second groups along a first dimension of the array, and further shifted with respect to adjacent second groups along a second dimension of the array.

The at least one floating diffusion region can include a first and a second floating diffusion region.

The photodiodes can be configured to dynamically and selectively be grouped in a first group arrangement in which the charges of the photodiodes in the group is stored the first floating diffusion regions and a second group arrangement in which the charges of the photodiodes in the group is stored the second floating diffusion regions.

Each of the groups can include at least one first photodiode configured to emit charges into the first and at least one second photodiode configured to emit charges into the second floating diffusion region.

BRIEF DESCRIPTION OF THE DRAWINGS

In order to understand the disclosure and to see how it may be carried out in practice, embodiments will now be described, by way of non-limiting examples only, with reference to the accompanying drawings, in which:

FIG. 1 is a prior art array of photodiodes in accordance with a first example;

FIG. 2 is a prior art array of photodiodes in accordance with another example;

DETAILED DESCRIPTION OF EMBODIMENTS

Figure 3:
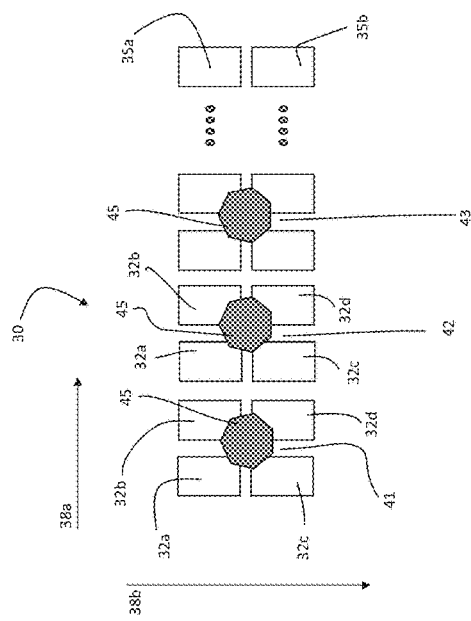
FIG. 3 is a prior art array of photodiodes in accordance with yet a further example.
Figure 4:
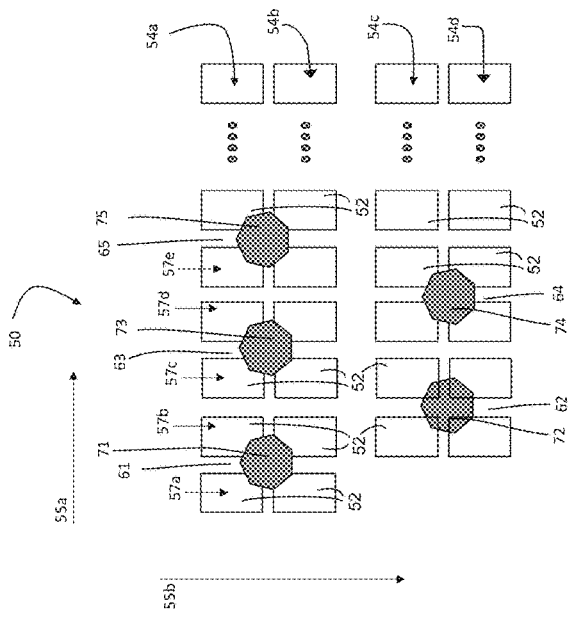
FIG. 4 is a schematic illustration of an array of photodiodes constructed and operative in accordance with an example of the presently disclosed subject matter.

FIG. 4 shows an array 50 of pixel sensor 52 arranged in a two-dimensional arrangement in which the pixels are disposed along a first row 54a, a second row 54b, a third row 54c, and a fourth row 54d. Each of the rows 54a to 54d, is arranged along a first dimension 55a of the array 50, here illustrated as left to right. In order to increase the sensitivity of the photodiodes 52 each sensor can have an elongated active area, arranged so that the length thereof extends along the second dimension 55b of the array 50. This way, the size of each pixel sensor does not compromise the resolution of the array 50 or does not require forming a larger array along the first dimension 55a.

In order to further increase the sensitivity of the array 50, the photodiodes 52 are grouped into pixel groups 61, 62, 63 etc., each having a floating diffusion region 71, 72, 73, etc. configured to store charges from the photodiodes in the group, allowing readout of the entire group through the binning operation.

The photodiodes 52 in each of the pixel groups 61, 62, 63 etc., are arranged along the first dimension 55a and the second dimension 55b, such that each pixel group includes, for example, four-photodiodes 52. This way, each pixel group 61, 62, 63, etc., provides a large active area which results in a much high sensitivity.

In order not to reduce the resolution of the array 50, the pixel groups 61, 62, 63 are arranged along the first dimension 55a of the array 50, however, at least one pixel group, here illustrated as pixel group 62, and 64, is shifted with respect to adjacent pixel groups 61, 63, and 65 along the first dimension 55a and the second dimension 55b of the array 50.

In other words, the array 50 includes a plurality of photodiodes 52 coaxially disposed in a matrix arrangement, i.e. disposed in four rows 54a-54d extending along the first dimension 55a, and in a plurality of columns 57a, 57b, 57c, etc., extending along the second dimension 55a. The pixel groups 61, 62, 63, etc., are arranged such that the photodiodes 52 of the first pixel group 61 are disposed on the first and second rows 54a and 54b, and the first and second columns 57a and 57b. I.e. the pixel groups 61 includes two photodiodes 52 on the first row 54a arranged along the first dimension 55a, and additional two photodiodes 52 on the second row 54b also arranged along the first dimension 55a. Since the second row 54b is parallelly disposed alongside the first row 54a, the photodiodes of the first row and those of the second row 54b form together a plurality of columns 57a, 57b, 57c, etc.

Turning now to the second pixel group 62, the four photodiodes 52 of this pixel group are arranged on the third and fourth rows 54c and 54d, and the second and third columns 57b and 57c. I.e. the pixel group 62 includes two pixel sensors 52 on the third row 54c arranged along the first dimension 55a, and additional two photodiodes 52 on the fourth row 54d also arranged along the first dimension 55a. Since the fourth row 54d is parallelly disposed alongside the third row 54c, the photodiodes of the third row 54c are arranged in columns 57a, 57b, 57c, etc. along the second dimension 55b.

Since however, the second pixel group 62 is disposed on columns 57b and 57c, the second pixel group 62 is slightly shifted with respect to the first pixel group 61 along the first dimension 55 of the array 50. This way, the image obtained by the array 50 includes a first pixel obtained by the first pixel group 61 and an adjacent pixel along a first dimension of the image obtained by the second pixel group 62.

Thus, while the photodiodes 52 in the array 50 are coaxially disposed in the rows 54a to 54d and coaxially disposed in columns 57a, 57b, 57c, etc., such that the array has a matrix arrangement, the pixel groups 61 and 62 are arranged shifted with respect to one another along both the first dimension as well as the second dimension.

It is noted that the first and second pixel groups 61 and 62, partially overlap with respect to the first dimension 55a, i.e. both first and second pixel groups 61 and 62 includes pixels on the second columns 57b. Thus, while each pixel group 61 and 62 includes pixels on two columns 57a and 57b, increasing thereby sensitivity of the group, the resolution of the array is maintained without having to increase the overall number of columns in the array 50.

Similarly, the pixels 52 of the third pixel group 63, according to this example is disposed on columns 57c and 57d, and is thus arranged slightly shifted with respect to the second pixel group 62 along the first dimension 55a. In addition, since the pixels 52 of the third pixel group 63 are disposed on the first and second rows 54a and 54b, the third pixel group 63 is slightly shifted with respect to the second pixel group 62 along the second dimension 55b, however along the same axis of the first pixel group 61. Further, the fourth pixel group 64, according to this example is arranged is disposed on columns 57d and 57e, and is thus slightly shifted with respect to the third pixel group 63 along the first dimension. In addition, since the fourth pixel group 64 is disposed on the third and forth rows 54a and 54b, the fourth pixel group 64 is slightly shifted with respect to the third pixel group 63 along the second dimension 55a, such that it is aligned with the second pixel group 62.

The above partially overlapping arrangement results in a Zigzag arrangement which is configured such that the array includes the desired number of pixel groups each of which provides a value to a single pixel along a first dimension in the obtained image. The above Zigzag arrangement allows however increasing the sensitivity of each imaging element, by binning a number of photodiodes disposed along both the first and second dimensions of the array 50. Thus, while each pixel group 61, 62, 63, 64 etc., includes pixels on more than one columns 57a, 57b, 57c, 57d, 57e, etc. increasing thereby sensitivity of the group, the resolution of the array is maintained without having to increase the overall number of columns in the array 50.

It is appreciated that although the pixel groups 61, 62, 63, etc., are arranged in an alternating sequence, according to another example, the pixel groups 61, 62, 63 etc., can be arranged such that two pixel groups are disposed on the first and second rows 54a and 54b while the following two pixel groups are disposed on the third and fourth rows 54c and 54d. Similarly, the pixel groups 61, 62, 63 etc., can be arranged such that two or more pixel groups are disposed on the first and second rows 54a and 54b while the following pixel group is disposed on the third and fourth rows 54c and 54d, such that most of the pixel groups are arranged on first and second rows 54a and 54b. It is appreciated that in the latter example, either the resolution of the array is compromised or the overall size of the array along the first dimension 55a must be increased.

According to a further example, the array can include only two rows of pixels with a plurality of columns. According to this example, each pixel group includes a pair of pixels one from each column. The groups are arranged along either the first row or the second row in an alternating arrangement, such that each pixel group shares one column with each of the adjacent pixel group, while is shifted by one column with respect to each of the adjacent pixel group. It is appreciated that by utilizing only two rows the sensitivity along the second dimension 55b, is reduced.

Figure 5:
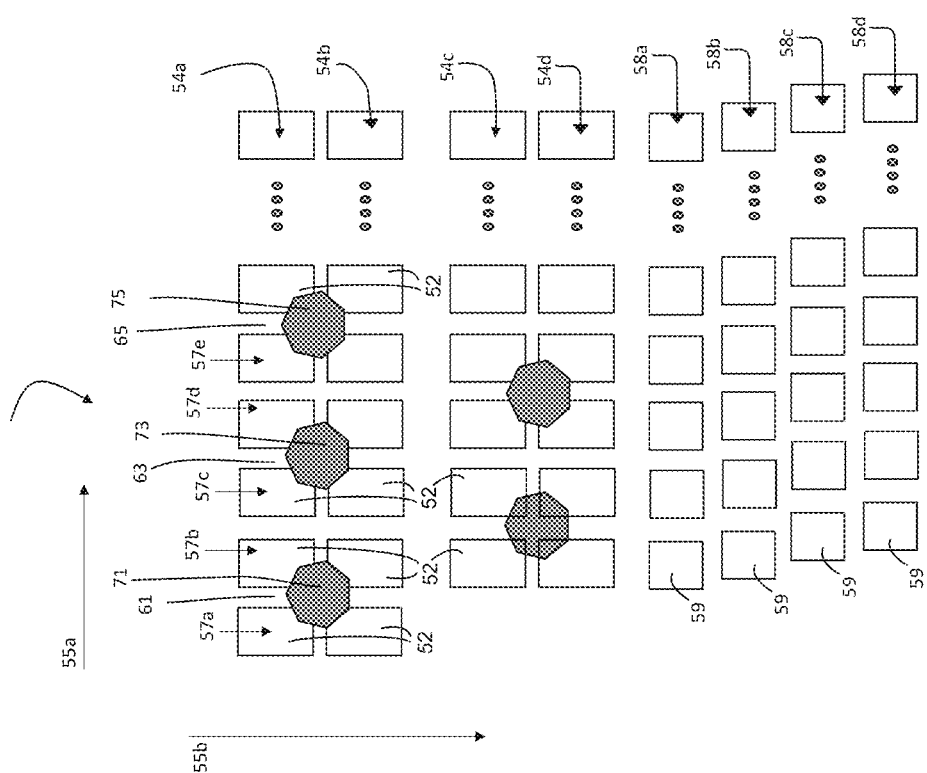
FIG. 5 is a schematic illustration of an array of photodiodes constructed and operative in accordance with an example of the presently disclosed subject matter.

With reference to FIG. 5, the array 50 of pixel sensor 52 can further include auxiliary rows of pixels 58a to 58d each having a plurality of pixels 59 arranged along the first dimension 55a. each of the rows of pixels 58a-58d is slightly shifted with respect to the other rows along the first dimension, such that the readout of all the pixels provides an overlapping zone, thereby increasing the accuracy of the array 50. Since the data obtained by the readout of groups 61, 62, 63, 64 etc. includes overlapping zones due to the fact that each group has one overlapping column with adjacent groups, the accuracy of the data may be compromised. Thus, the data obtained by the readout of rows 54a-54d can be combined with the readout of rows 58a-58d, increasing thereby the overall resolution. According to an example, the data by which the image is built can be an average of the by the readout of rows 54a-54d and that of rows 58a-58d.

Figure 6:
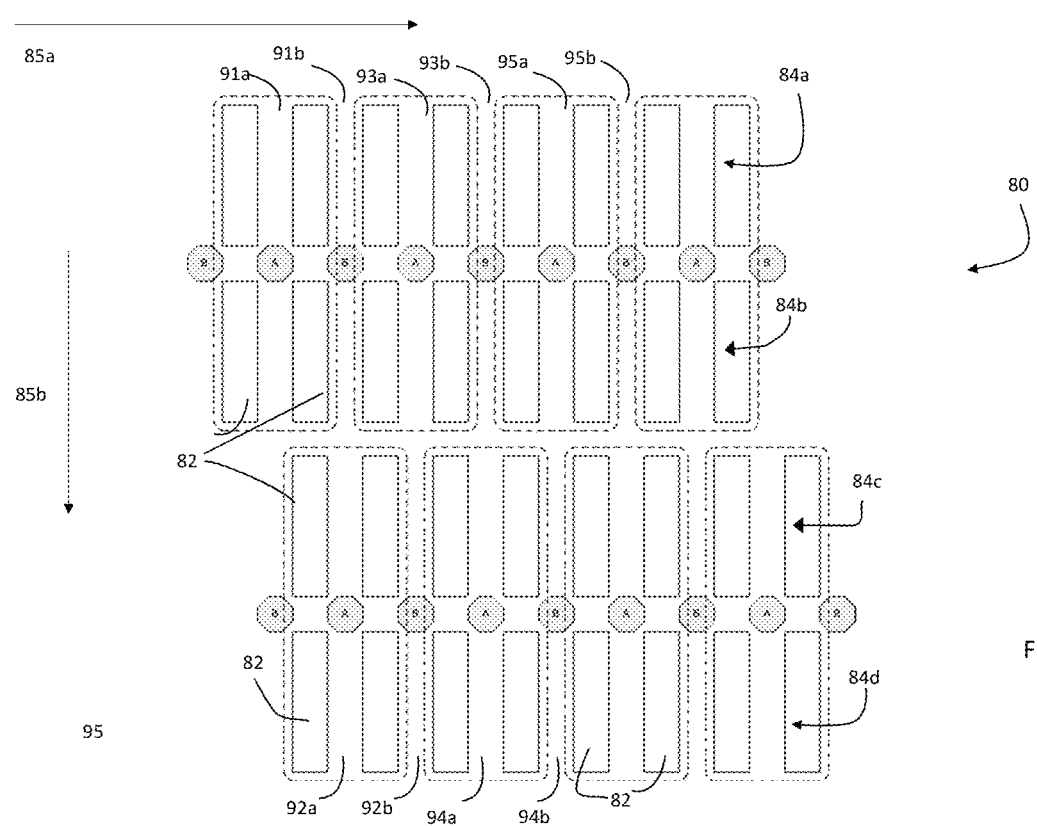
FIG. 6 is a schematic illustration of an array of photodiodes constructed and operative in accordance with yet another example of the presently disclosed subject matter.

FIG. 6 illustrates an array of photodiodes 80 according to another example of the presently disclosed subject matter. The array 80 is substantially the same at the array 50 described herein above with respect to FIG. 4, and includes a plurality of photodiodes 82 arranged in a two dimensional arrangement. I.e. the pixels 82 are disposed in a four rows 84a-84d arranged along a first dimension 85a of the array 80.

As in the example of FIG. 4, in order to further increase the sensitivity of the array 80, the photodiodes 82 are grouped into multiple-pixel pixel groups 91a, 92a, 93a etc., each having a first floating diffusion region 88a configured to store charges from the photodiodes in the group, allowing readout of the entire group through the binning operation. In addition, in order not to reduce the resolution of the array 80, the pixel groups 91a, 92a, 93a are arranged in an overlapping arrangement along first dimension 85a of the array 50, by disposing the pixel groups on either first and second rows

84a and 84b or on the third and fourth rows 84c-84d in an alternating arrangement, as described above. according to the present example however, the array 80 further includes a plurality of second floating diffusion region 88b each being disposed between two floating diffusion regions 88a. The photodiodes 82 in the array 80 are configured such that four adjacent pixels can be dynamically grouped around either the first floating diffusion region 88a or the second floating diffusion region 88b. That is to say, in one instance the photodiodes 82 can be grouped in a first group arrangement into groups 91a, 92a, 93a and release charges thereof into the first floating diffusion region 88a while, in another instance the photodiodes 82 can 82 can be grouped in a second group arrangement into groups 91b, 92b, 93b around the second floating diffusion regions 88b and to release charges thereto.

The array can thus be arranged that the first and second floating diffusion regions 88a and 88b are arranged in an alternating arrangement, along the array 80. This way, the array 80 can be utilized to selectively detect two signals, one signal with the photodiodes 82 being coupled to the first floating diffusion regions 88a and to detect another signal by coupling to the second floating diffusion regions 88b.

Those skilled in the art to which the presently disclosed subject matter pertains will readily appreciate that numerous changes, variations, and modifications can be made without departing from the scope of the invention, mutatis mutandis.

The invention claimed is:

1. An active pixel sensor comprising:
    a two-dimensional array of photodiodes arranged in at least one first row and at least one second row of photodiodes and a plurality of columns of photodiodes;
    a plurality of floating diffusion regions each of which being coupled to a group of photodiodes from said two-dimensional array and being configured to receive electrons generated by photodiodes in said group, such that said group defines a single sensing pixel, and such that said two-dimensional array defines a plurality of groups;
    wherein said plurality of groups includes at least one first group disposed on said first row of photodiodes, and at least one second group disposed on a said second row of photodiodes;
    wherein said first group, defining a first sensing pixel, includes at least one photodiode on a first column and at least one photodiode on a second column, and said second group, defining a second sensing pixel, includes at least one photodiode on said second column and at least one photodiode on a third column;
    wherein said first row of said array includes two first adjacent rows, and said second row of said array includes two second adjacent rows; and
    wherein each of said first groups includes at least four photodiodes, two of which being disposed on one of said two first adjacent rows, and two of which being disposed on the other one of said two first adjacent rows, and each of said second groups includes at least four photodiodes, two of which disposed on one of said two second adjacent rows, and two of which disposed on the other one of said two second adjacent rows.

2. The active pixel sensor of claim 1 wherein said at least one first group includes a plurality of first groups disposed along said first row of said array, and said at least one second group includes a plurality of second groups disposed along said second row of said array.

3. The active pixel sensor of claim 2 wherein each one of said second groups is disposed adjacent two of said first groups, such that at least one photodiode of said second group is on the same column as at least one photodiode of one of said two first groups, and at least one photodiode of said second group is on the same column as at least one photodiode of the other one of said two first groups.

4. The active pixel sensor of claim 1 wherein said plurality of columns are disposed along a first dimension of said array, and wherein resolution along a first dimension of an image obtained by said active pixel sensor corresponds to the number of said plurality of columns; and wherein sensitivity of said image corresponds to the number of rows disposed along a second dimension of said array.

5. The active pixel sensor of claim 1 and wherein each one of said plurality of first groups is shifted with respect to adjacent first groups and with respect to adjacent second groups along a first dimension of said array, and further shifted with respect to adjacent second groups along a second dimension of said array.

6. The active pixel sensor of claim 1 wherein each one of said first groups partially overlap with two adjacent second groups.

7. The active pixel sensor of claim 1 wherein said floating diffusion regions includes a first and a second floating diffusion region.

8. The active pixel sensor of claim 7 wherein said photodiodes are configured to dynamically and selectively be grouped in a first group arrangement in which the charges of the photodiodes in the group is stored said first floating diffusion regions and a second group arrangement in which the charges of the photodiodes in said group is stored said second floating diffusion regions.

9. The active pixel sensor of claim 7 wherein each of said groups includes at least one first photodiode configured to emit charges into said first and at least one second photodiode configured to emit charges into said second floating diffusion region.

10. A method for detecting light with an active pixel sensor, the method comprising:
    providing a two-dimensional array of photodiodes arranged in at least one first row and at least one second row of photodiodes and a plurality of columns of photodiodes defining a plurality of groups of photodiodes;
    forming a plurality of floating diffusion regions, each of which being coupled to one of said groups, and being configured to receive electrons generated by photodiodes in said group;
    wherein said plurality of groups includes at least one first group defined on said first row of photodiodes, and at least one second group defined on said second row of photodiodes;
    wherein said first group, defining a first sensing pixel, includes at least one photodiode on a first column and at least one photodiode on a second column and said second group, defining a second sensing pixel, includes at least one photodiode on said second column and at least one photodiode on a third column;
    wherein said first row of said array includes two first adjacent rows, and said second row of said array includes two second adjacent rows; and
    wherein each of said first groups includes at least four photodiodes, two of which being disposed on one of said two first adjacent rows, and two of which being disposed on the other one of said two first adjacent rows, and each of said second groups includes at least four photodiodes, two of which disposed on one of said two second adjacent rows, and two of which disposed on the other one of said two second adjacent rows.

11. The method according to claim 10 wherein said at least one first group includes a plurality of first groups disposed along said first row of said array, and said at least one second group includes a plurality of second groups disposed along said second row of said array.

12. The method according to claim 10 wherein each one of said second groups is disposed adjacent two of said first groups, such that at least one photodiode of said second group is on the same column as at least one photodiode of one of said two first groups, and at least one photodiode of said second group is on the same column as at least one photodiode of the other one of said two first groups.

13. The method according to claim 10 and wherein each one of said plurality of first groups is shifted with respect to adjacent first groups and with respect to adjacent second groups along a first dimension of said array, and further shifted with respect to adjacent second groups along a second dimension of said array.

14. The method according to claim 10 wherein said floating diffusion regions includes a first and a second floating diffusion region.

15. The method according to claim 14 wherein said photodiodes are configured to dynamically and selectively be grouped in a first group arrangement in which the charges of the photodiodes in the group is stored said first floating diffusion regions and a second group arrangement in which the charges of the photodiodes in said group is stored said second floating diffusion regions.

16. The method according to claim 14 wherein each of said groups includes at least one first photodiode configured to emit charges into said first and at least one second photodiode configured to emit charges into said second floating diffusion region.

\* \* \* \* \*